United States Patent [19]
Eguchi et al.

[11] Patent Number: 5,337,366
[45] Date of Patent: Aug. 9, 1994

[54] ACTIVE CONTROL APPARATUS USING ADAPTIVE DIGITAL FILTER

[75] Inventors: Masaki Eguchi, Kitakatsuragi; Jun Saitoh, Yao; Hiroyuki Iida, Fujiidera; Kozo Hiyoshi, Amagasaki, all of Japan

[73] Assignee: Sharp Kabushiki Kaisha, Osaka, Japan

[21] Appl. No.: 86,133

[22] Filed: Jul. 6, 1993

[30] Foreign Application Priority Data

Jul. 7, 1992 [JP] Japan .................................. 4-178751
Nov. 25, 1992 [JP] Japan .................................. 4-315325

[51] Int. Cl.$^5$ ............................................ G10K 11/16
[52] U.S. Cl. ................................... 381/71; 381/94
[58] Field of Search ................................ 381/71, 94

[56] References Cited

U.S. PATENT DOCUMENTS

| | | | |
|---|---|---|---|
| 4,987,598 | 1/1991 | Eriksson | 381/71 |
| 5,172,416 | 12/1992 | Allie et al. | 381/71 |
| 5,259,033 | 11/1993 | Goodings et al. | 381/83 |

Primary Examiner—Forester W. Isen

[57] ABSTRACT

An active control apparatus using an adaptive IIR digital filter includes a coefficient control portion for updating the filter coefficient of adaptive IIR digital filter so as to minimize an output error signal level, and a coefficient control portion for updating the filter coefficient of a recursive portion so as to minimize the output level of recursive portion. The filter coefficient of recursive filter is updated by these two coefficient control portions and in parallel or in a time-dividing manner.

8 Claims, 18 Drawing Sheets

S: SOUND TO BE DETECTED
N: NOISE

ACTIVE CONTROL APPARATUS USING ADAPTIVE DIGITAL FILTER

BACKGROUND OF THE INVENTION

1. Field of the Invention

The present invention relates generally to active control apparatuses using adaptive digital filters, and more specifically, to an active control apparatus utilizing an adaptive digital filter for use in a signal control circuit used in an active noise cancellation apparatus, an active vibration control apparatus, an echo canceler, adaptive equivalent equipment and other active control systems.

2. Description of the Related Art

One example of an active noise control apparatus using an adaptive digital filter is shown in FIG. 11. In this apparatus, active cancellation of noise in a duct is conducted.

Referring to FIG. 11, a noise source 11 is present in a duct 12 having an opening at one end, and a microphone for detecting noise 13, a microphone for detecting noise cancellation error 14, and a speaker for noise cancellation 15 are disposed.

A noise detection signal $xi(n)$ detected at noise detection microphone 13, then passed through an amplifier 22 and converted into a digital signal at an A/D converter 25 is added to the output $v1(n)$ of a first adaptive FIR (Finite Impulse Response) digital filter 41 at an adder 42 to be a signal $u1(n)$, and is input into a second adaptive FIR digital filter 43. The output $y1(n)$ of second digital filter 43 is output as a noise cancellation signal to a D/A converter 26. The noise cancellation signal converted into an analog signal at D/A converter 26 is output to noise cancellation speaker 15 through an amplifier 23. The output $u1(n)$ of adder 42 is input to a first coefficient control portion 44 and an FIR digital filter for correction 45. Cancellation signal $y1(n)$ is input to first adaptive digital filter 41 and first coefficient control portion 44. The output $u11(n)$ of correction digital filter 45 is input to a second coefficient control portion 46. The result of noise cancellation is detected at noise cancellation error detection microphone 14, and input as a noise cancellation error signal $e1(n)$ to second coefficient control portion 46 through an amplifier 24 and an A/D converter 27.

The input-output relation of first adaptive digital filter 41 is given by the following equation (1):

$$v1(n) = \sum_{i=0}^{M-1} a1(i) \cdot y1(n-i) \quad (1)$$

where $a1(i)$ is the filter coefficient of first adaptive digital filter 41, and M is the tap number of filter 41. $(n)$ and $(n-i)$ represent time.

Similarly, the input-output relation of second adaptive digital filter 44 is given by the following equation (2):

$$y1(n) = \sum_{i=0}^{N-1} b1(i) \cdot u1(n-i) \quad (2)$$

where $b1(i)$ is the filter coefficient of second adaptive digital filter 43, and N is the tap number of filter 43. The filter coefficient $a1(i)$ of first digital filter 41 is serially updated by the following coefficient updating formula (3) for the purpose of removing an acoustic feedback component detected at noise detection microphone 13 which has been created from sound output from noise cancellation speaker 15 and passed through duct 12.

$$a1(i,n+1) = a1(i,n) - \alpha 1 \cdot y1(N-i) \cdot u1(n) \quad (3)$$

where $\alpha$ takes a small positive value in step size parameter. Updating filter coefficient $a1(i)$ based on equation (3) provides a signal $u1(n)$ with a component of noise detection signal $x1(n)$ correlated with noise cancellation signal $y1(n)$ being canceled. Accordingly, removal of the above-described feedback component can be achieved, contributing to suppression of howling and increase of noise cancellation effect. Coefficient updating based on equation (3) is performed at first coefficient control portion 44.

The filter coefficient $b1(i)$ of second adaptive digital filter 43 is updated by the following equation (4), so that the mean electric power of error signal $e1(n)$ is minimized.

$$b1(i,n+1) = b1(i,n) - \beta 1 \cdot u11(n-i) \cdot e1(n) \quad (4)$$

where $\beta 1$ takes a small positive value in a step size parameter $u11(n)$ is produced by correcting the input signal $u1(n)$ of second adaptive digital filter 43 using correction digital filter 45 and is given by the following equation (5).

$$u_{11}(n) = \sum_{i=0}^{L-1} h1(i) \cdot u1(n-i) \quad (5)$$

where $h1(i)$ is the filter coefficient of correction digital filter 45, and L is the tap number of filter 45. Correction digital filter 45 is characterized by a transfer coefficient from the output $y1(n)$ of second digital filter 43 via noise cancellation error detection microphone 14 to second coefficient control portion 46. Coefficient updating based on equation (4) is performed at second coefficient control portion 46.

As a conventional technique, a digital filter having a previously calculated coefficient may be used in place of first adaptive FIR digital filter 41. At the time, the transfer characteristic of an acoustic feedback path from the output $y1(n)$ of second adaptive FIR digital filter 43 via noise cancellation Speaker 15, and noise detection microphone 13 to the input $u1(n)$ of second adaptive digital filter 43 is identified, and a filter coefficient for reproducing the characteristic is set.

In a conventional active noise control apparatus as illustrated in FIG. 11, if a noise waveform to be canceled is a random waveform, only acoustic feedback component can be canceled by updating the filter coefficient based on equation (3). Updating of the filter coefficient based on equation (3) however minimizes the mean electric power of signal $u1(n)$, and if a noise waveform is periodic, not only the acoustic feedback component but also the noise component itself is canceled. Accordingly, cancellation of resonant mode frequency in the duct cannot be performed. A conventional active noise control apparatus therefore cannot be applied to noise having a periodic element. This disadvantage is attributable to the fact that coefficient updating based on equation (3) is continued even if error signal $e1(n)$ becomes 0, and the periodic component of signal $u1(n)$ is canceled. Further, if a method of fixing the filter coefficient of first adaptive FIR digital filter 41 is employed, the transfer characteristic of the acoustic feedback path should be previously measured. This approach lacks adaption to change in external environment.

When duct noise cancellation is performed using an active noise cancellation system with the above described adaptive FIR digital filter without first adaptive FIR digital filter 41 in FIG. 11, the following disadvantage is also encountered. A sound wave output from noise cancellation speaker 15 propagates toward noise detection microphone 13, and therefore a standing wave is generated in the upstream of noise cancellation speaker 15. Assuming that the distance L1 between noise cancellation speaker 15 and noise detection microphone 13 and the wavelength λn of a sound wave are represented by the following equation:

$$\lambda n = 2/n \cdot L1 (n=1,2,\ldots) \quad (6)$$

the node of the standing wave is at the position of noise detection microphone 13, the sound wave of wavelength λn cannot be detected, and therefore the sound of frequency cannot be canceled. This is illustrated in FIG. 12. In active noise cancellation utilizing FIR digital filters until today, a sound absorbing material is provided to the inner wall of a duct to reduce a standing wave ratio (SWR: amplitude ratio of node to antinode of standing wave), and the amount of acoustic feedback is restrained.

In order to overcome the above-described disadvantage, an IIR (Infinite Impulse Response) digital filter may be used in place of an FIR digital filter. A structure of an IIR digital filter 16 is schematically shown in FIG. 13. IIR digital filter 16 is formed of a non-recursive portion 18 and a recursive portion 17. If IIR digital filter 16 as such is employed for active noise cancellation, successful for updating of a filter coefficient adaptively could cancel some acoustic feedback by the function of recursive portion 17.

Now, the IIR digital filter will be described.

Generally, the transfer function H(z) of an adaptive IIR digital filter is given by the following equation (7):

$$H(z) = \frac{\sum_{i=0}^{N-1} a(i) z^{-i}}{1 + \sum_{j=1}^{M} b(j) z^{-j}} \quad (7)$$

FIG. 14 illustrates a specific structure of such an adaptive IIR digital filter. The adaptive IIR digital filter includes a unit delay element 28, a multiplier 29, and an adder 30. An input signal u is applied to adder 30 through unit delay element 28 and multiplier 29, and is subject to addition at adder 30 to be output as an output signal y. $a(i)$ and $b(j)$ represent filter coefficients. Herein, an FIR digital filter portion formed of filter coefficient $a(i)$ and implementing transfer function $H_N(z)$ given by the following equation (8) corresponds to the non-recursive portion 18 of adaptive FIR digital filter 16.

$$H_N(z) = \sum_{i=0}^{N-1} a(i) z^{-i} \quad (8)$$

The portion formed of filter coefficient $b(j)$ and implementing a transfer function $H_R(z)$ given by the following equation (9) corresponds to recursive portion 17.

$$H_R(z) = \frac{1}{1 + \sum_{j=1}^{M} b(j) z^{-j}} \quad (9)$$

For the input signal u(n) and output signal y(n) of adaptive IIR digital filter 16, the input-output relation is given by the following equation (10).

$$y(n) = \sum_{i=0}^{N-1} a(i) u(n-i) + \sum_{j=1}^{M} b(j) y(n-j) \quad (10)$$

where N represents the tap number of non-recursive portion 18, while M the tap number of recursive portion 17. There are various kinds of updating algorithms for filter coefficients, one of which is to update a filter coefficient based on the following equations (11) and (12).

$$a(i,n+1) = a(i,n) + \alpha u(n-1)e(n) \quad (11)$$

$$b(j,n+1) = b(j,n) + \beta y(n-j)e(n) \quad (12)$$

where $e(n)$ represents an output error $d(n) - y(n)$ between a desired response $d(n)$ and filter output $y(n)$, and $\alpha$ and $\beta$ represent step size parameter and takes a small positive value. Further, in order to increase the stability and convergence of filter coefficient updating, $f(n)$ given by the following equation (13) may be used in place of $e(n)$ in equations (11) and (12).

$$f(n) = e(n) + \sum_{l=1}^{L2} c(l) e(n-l) \quad (13)$$

where $c(l)$ represents the weight of a moving average, and is a predetermined constant. L2 represents the number of data over which the moving average is calculated.

Adaptive IIR digital filter 36 shown in FIG. 15 is the same as that in FIG. 14 with a filter coefficient updating control portion. Connection is made in non-recursive portion 18 so that input signal u(n) and output error signal e(n) are input to coefficient control portion 20 and control signals are input to respective multipliers 29 from coefficient control portion 20. Meanwhile, on the side of recursive portion 17, connection is made so that output signal y(n) and output error signal e(n) are input to coefficient control portion 21, and control signals are input to respective multipliers 29 from coefficient control portion 21. In the case of using equation (13) as well as in the cases of using the following equations (14) and (15) in place of $u(n-i)$ of equation (11) and $y(n-j)$ of equation (12), a structure basically the same as that shown in FIG. 15 is attained, and processing can be performed within coefficient control portions 20 and 21.

$$u_0(i, n) = u(n-i) + \sum_{k=1}^{M} b(k, n) u_0(i, n-k) \quad (14)$$

$$y_0(j, n) = y(n-j) + \sum_{k=1}^{M} b(k, n) y_0(j, n-k) \quad (15)$$

FIG. 16 illustrates application of the above-described adaptive IIR digital filters 16, 36 to the processing portion of an active noise cancellation apparatus which suppresses noise, by radiating a sound wave having the same amplitude as and 180° out of phase from the noise from a noise cancellation speaker, thereby causing sound wave interference. The content of FIG. 16 is basically the same as FIG. 11. A detection signal detected at noise detection microphone 13 is sent through preamplifier 22 to A/D converter 25 for analog-digital conversion, and the digitized signal is input to adaptive IIR digital filter 16. Input signal u(n) detected at noise detection microphone 13 is subject to an operation based on equation (10) at adaptive IIR digital filter 16, and the result of operation y(n) is output as a noise cancellation signal from noise cancellation speaker 15 through D/A converter 26 and power amplifier 23. The filter coefficient a(i) of the non-recursive portion 18 of adaptive IIR digital filter 16 and the filter coefficient b(j) of recursive portion 17 are serially updated at coefficient control portions 20 and 21 in response to a noise cancellation error signal $-e(n)$ detected at noise cancellation error detection microphone 14 and based on signals input to respective coefficient control portions 20, 21 through preamplifier 24 and A/D converter 27. The detection signal detected at noise detection microphone 13 is input to coefficient control portion 20 through a digital filter 32 rather than through adaptive IIR digital filter 16, while the noise cancellation signal is input to coefficient control portion 21 directly from adaptive IIR digital filter 16 through a digital filter 31 rather than through noise cancellation error detection microphone 14.

Using equations (11) and (12), the updating formula is given by the following equations (16) and (17).

$$a(i,n+1)=a(i,n)+\alpha u2(n-i)\,e(n) \quad (16)$$

$$b(j,n+1)=b(j,n)+\beta y2(n-j)\,e(n) \quad (17)$$

u2(n) is produced by correcting the input signal u(n) of adaptive IIR digital filter 16 using digital filter 32, while y2(n) is produced by correcting the output signal y(n) of adaptive IIR digital filter 16 using digital filter 31. Digital filters 31 and 32 are characterized by the transfer characteristic from the output of adaptive IIR digital filter 16 via noise cancellation error detection microphone 14 to respective coefficient control portions 20 and 21.

Another conventional example is the one shown in FIG. 17 wherein desired response d is directly obtained. In this case, input signal u is subject to an operation at the non-recursive portion 18 and recursive portion 17 of adaptive IIR digital filter 16. The result of operation y is output as a noise cancellation signal, and the noise cancellation signal is compared to desired response d. A signal corresponding to noise cancellation error signal e is input to respective coefficient control portions 20 and 21. Output signal y is input to coefficient control portion 20 through recursive portion 17, input signal u is input to coefficient control portion 21 through recursive portion 17, and the filter coefficient of the non-recursive portion is updated. Thus, the $u_o(i,n)$ and $Y_o(j,n)$ of equations (14) and (15) are employed in place of $u(n-i)$ and $y(n-j)$ in equations (11) and (12).

In updating the filter coefficient of adaptive IIR digital 36 having recursive portion 17 as illustrated in FIG. 15, the instability and divergence of the filter can occur. The recursive portion 17 of adaptive IIR digital filter 36 sometimes suffers from divergence of its output in the course of updating the filter coefficient. In updating of the filter coefficient of recursive portion 17 is performed so as to minimize the level of the output of recursire portion or adaptive IIR digital filter 36 in parallel, a signal can be restrained from diverging at recursive portion 17, but if the input signal of adaptive IIR digital filter 36 is periodic and the periodic signal is necessary as the output of adaptive IIR digital filter 36, that necessary periodic signal is canceled at the recursive portion.

Furthermore, if equations (16) and (17) are used, the amount of calculation is increased. However, regardless of the amount of calculation, high speed operation is required. Application to active noise cancellation control requires operations at digital filters 31 and 32 as pre-processing of coefficient control portions 20 and 21, as illustrated in FIG. 16, naturally resulting in increase in the amount of calculation.

SUMMARY OF THE INVENTION

It is therefore one object of the invention to achieve stable filter coefficient updating in an active control apparatus using an adaptive digital filter.

Another object of the invention is to perform noise cancellation effect to periodic sounds in an active noise control apparatus using an adaptive digital filter.

Yet another object of the invention is to make it easier to update coefficients in an active control apparatus using an adaptive digital filter.

A still further object of the invention is to increase stability in an active control apparatus using an adaptive digital filter.

The above-described objects of the invention are achieved by an active control apparatus including the following elements for controlling the physical amount of events at a desired value. More specifically, an active control apparatus according to the invention includes a detector for detecting the amount of physical development; a control signal output unit responsive to a detection signal obtained by the detector for outputting a control signal for controlling the amount of physical development to be a desired amount; an error output unit for outputting an error between a desired amount of physical development and an actual amount of physical development.

The control signal output unit includes an adaptive digital filter formed of a non-recursive filter and a recursive filter, a first coefficient controller for updating the filter coefficient of the adaptive digital filter so as to minimize the level of an output signal from the error output unit, and a second coefficient controller for controlling the filter coefficient of the recursive filter so as to minimize the level of an output signal from the recursive filter.

The active control apparatus according to the invention includes the first coefficient controller for updating the filter coefficient so as to minimize the output level of the error output unit, and the second coefficient controller for updating the filter coefficient so as to minimize the output level of the recursive filter, and therefore divergence of a signal in the recursive filter can be suppressed. If noise generated from a noise source is a random sound, a noise signal will not be canceled by the recursive filter even if the filter coefficient of the recursive filter is updated so as to minimize the output level of the recursive filter. As a result, stable updating of the filter coefficient can be achieved in the adaptive digital filter including the recursive filter.

The control signal output unit preferably includes an operation unit for operating the second coefficient controller in response to the detected level of the level detector for detecting the level of a control signal. When the output level of the recursive filter to be a control signal for the filter coefficient of the recursive filter is more than a prescribed reference value, the filter coefficient is updated so as to minimize the output level of the recursive filter, and therefore divergence of the signal of the recursive filter is suppressed. If noise generated from the noise source is a periodic sound, the updating of the filter coefficient so as to minimize the output level of the recursive filter is not performed as far as the output level of the recursive filter is less than a prescribed reference value. Accordingly, necessary periodic signals are not entirely canceled at the recursive filter, and a further effective active control apparatus for periodic sound is provided.

According to another aspect of the invention, an active control apparatus for controlling the amount of physical development to be a desired value includes a detector for detecting the amount of physical development; a control signal output unit responsive to a detection signal obtained from the detector for outputting a control signal for controlling the amount of physical development to be the desired value; an error output unit for outputting the error between the desired amount of physical development and actual amount of physical development.

The control signal output unit includes an adaptive digital filter, formed of a non-recursive filter and a recursive filter, the detection signal being sent to the non-recursive filter via the recursive filter, an output signal from the non-recursive filter becoming a control signal; a first coefficient controller responsive to an output signal from the error output unit for updating the filter coefficient of the non-recursive filter so as to minimize the output level; and a second coefficient controller responsive to an output signal from the error output unit and the control output signal for controlling the filter coefficient of the recursive filter.

According to another aspect of the invention, the second coefficient controller controlling the filter coefficient of the recursive filter updates the filter coefficient of the recursive filter in response to the error signal and an output signal from the non-recursive filter.

Accordingly, the control signal is free from the influence of the recursive filter. As a result, updating of the filter coefficient of the non-recursive filter can be performed in the same manner as coefficient updating of an FIR digital filter. Thus, an active control apparatus which makes it easier to update a coefficient can be provided.

The foregoing and other objects, features, aspects and advantages of the present invention will become more apparent from the following detailed description of the present invention when taken in conjunction with the accompanying drawings.

Figure 7:
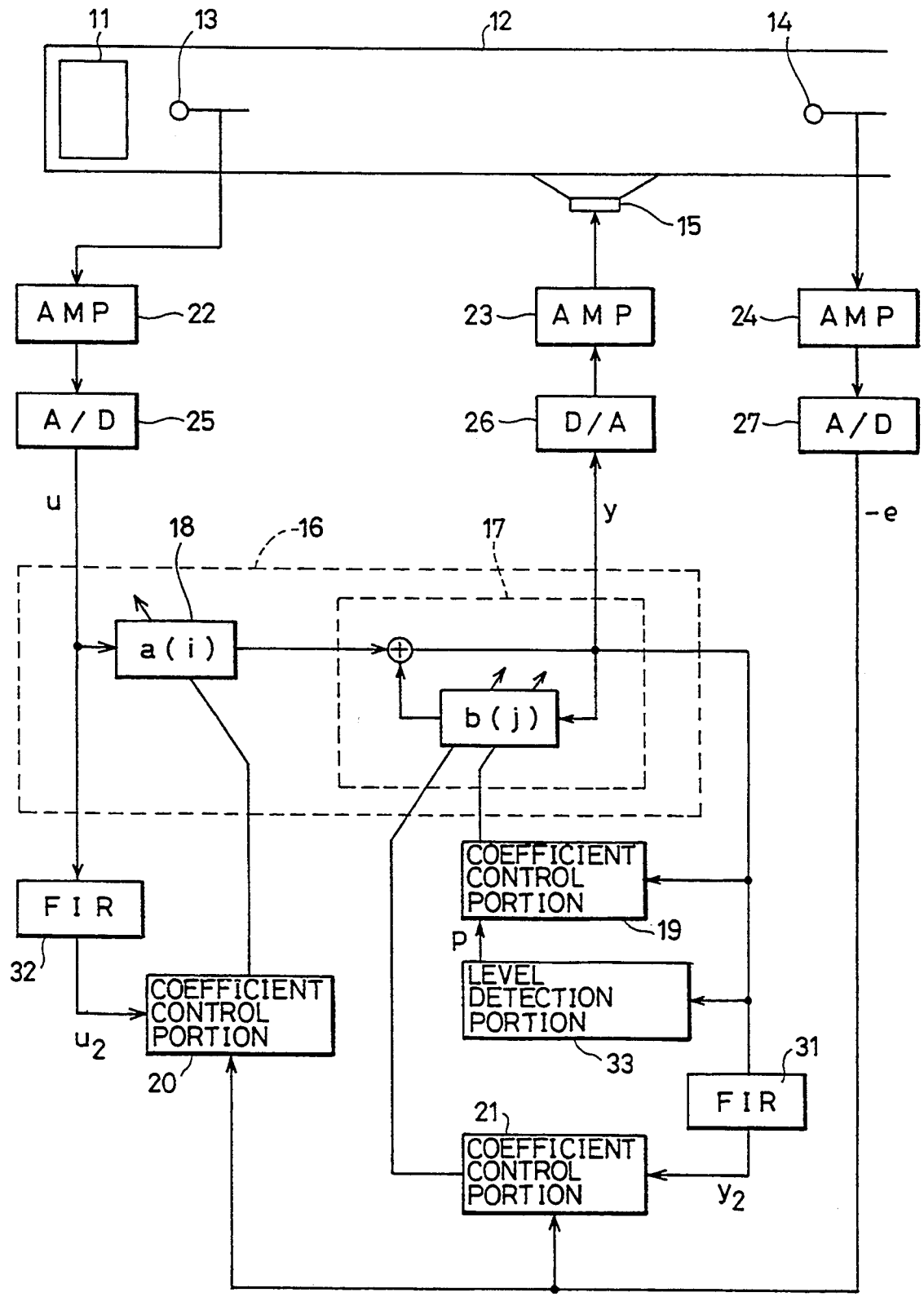
Figure 8:
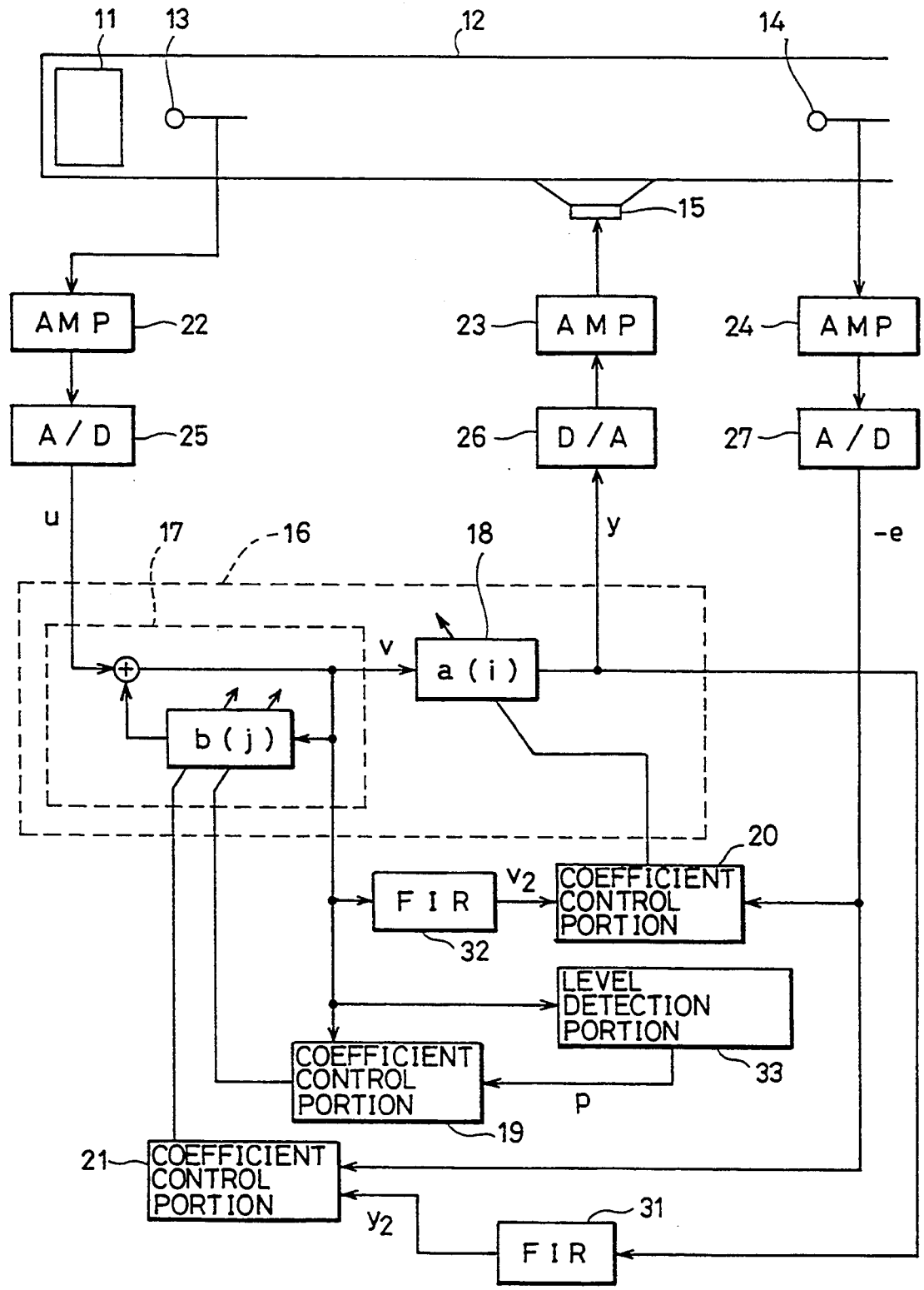
Figure 9:
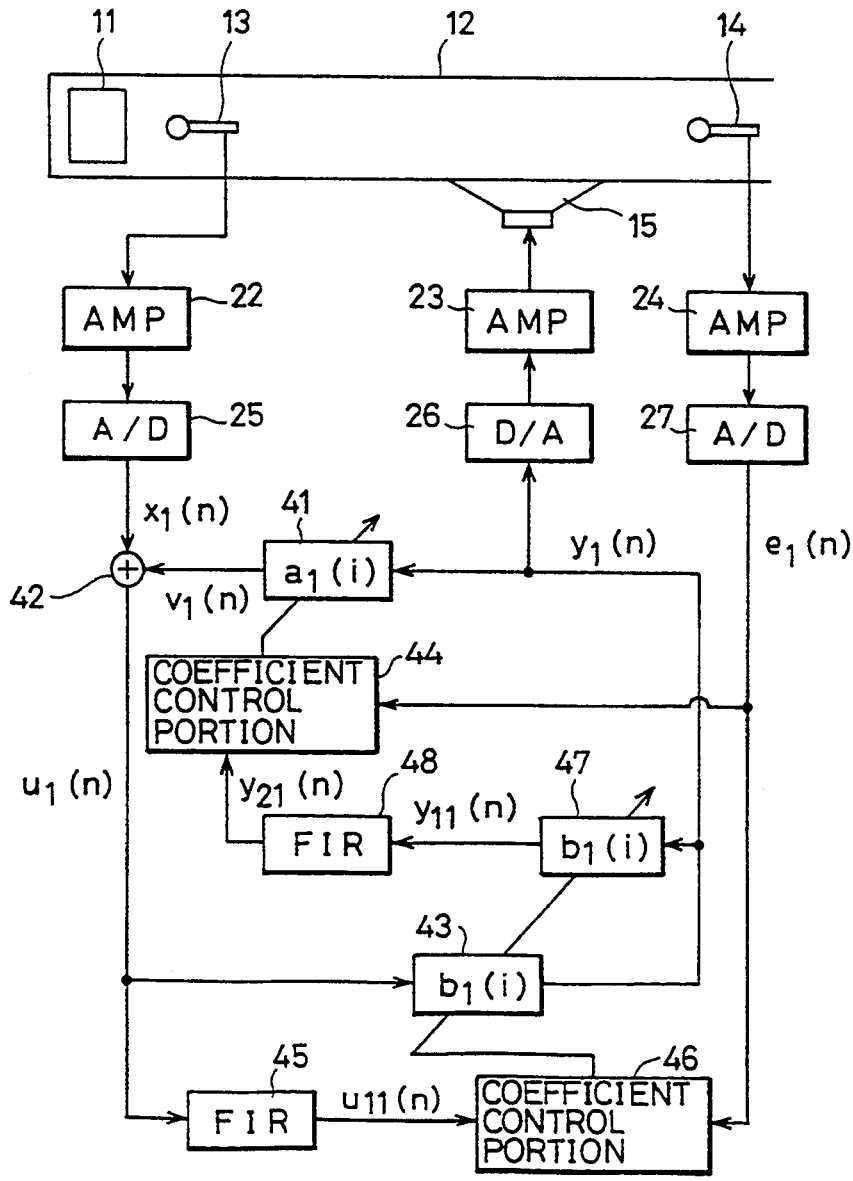
Figure 10:
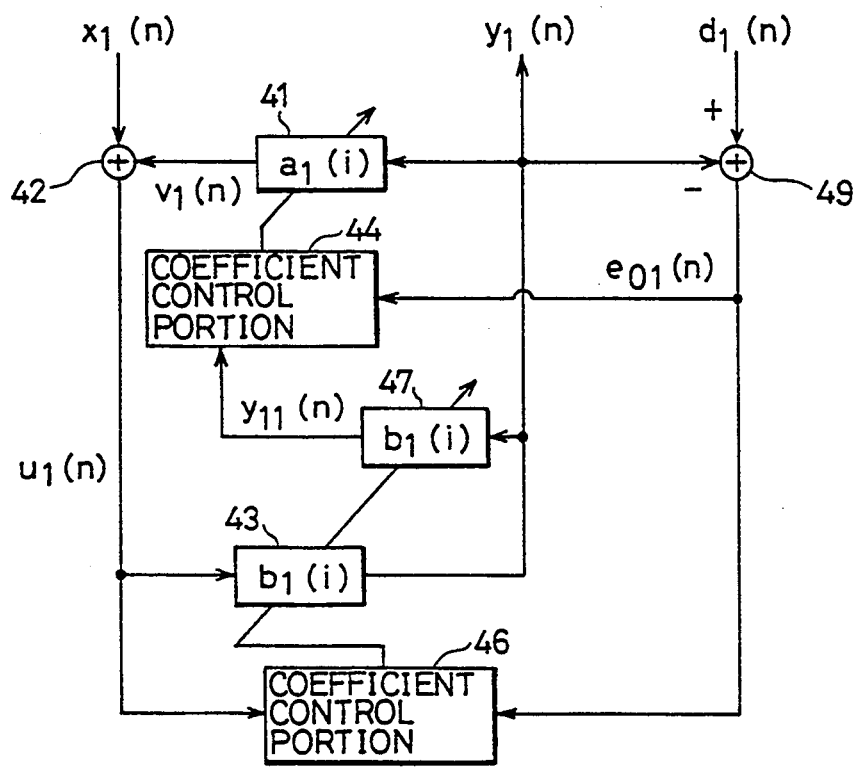
Figure 11:
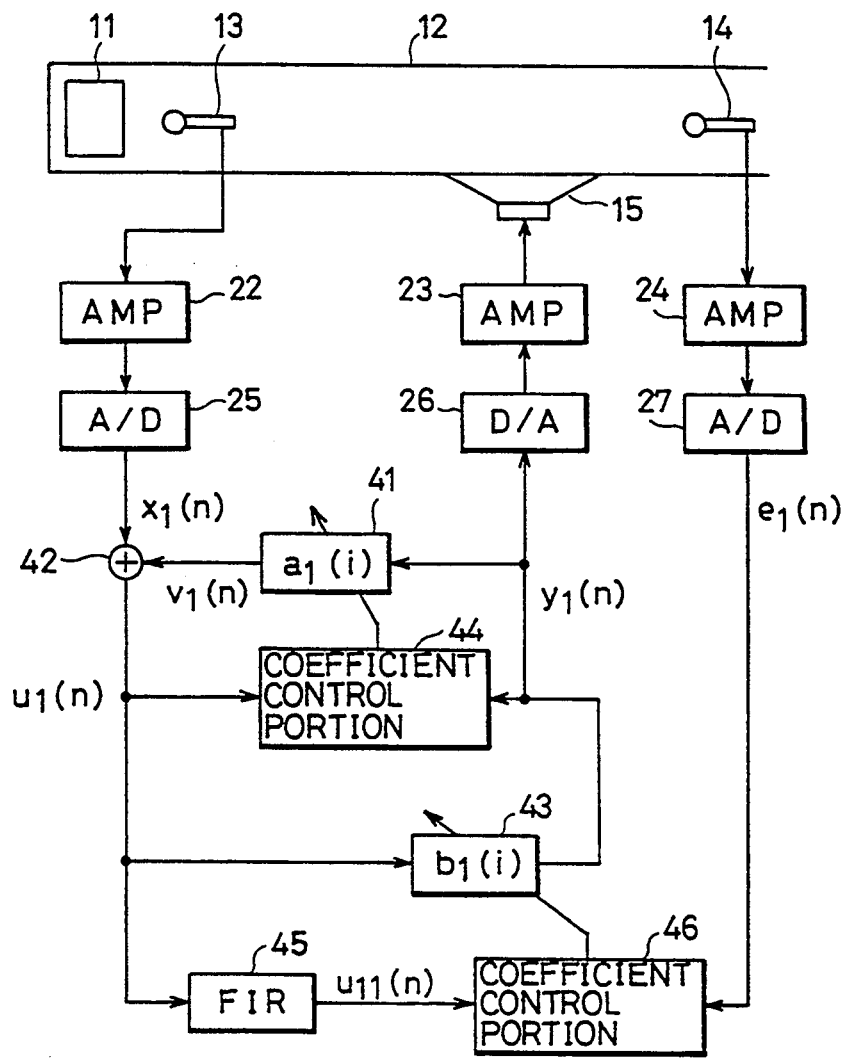
Figure 12:
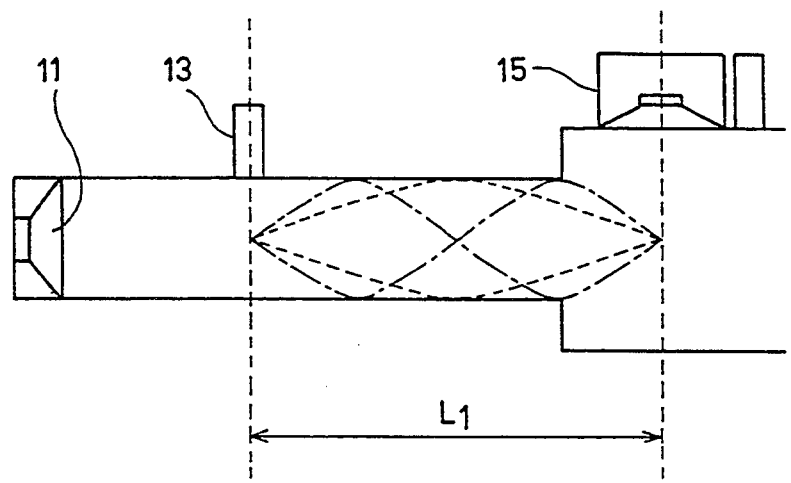
Figure 13:
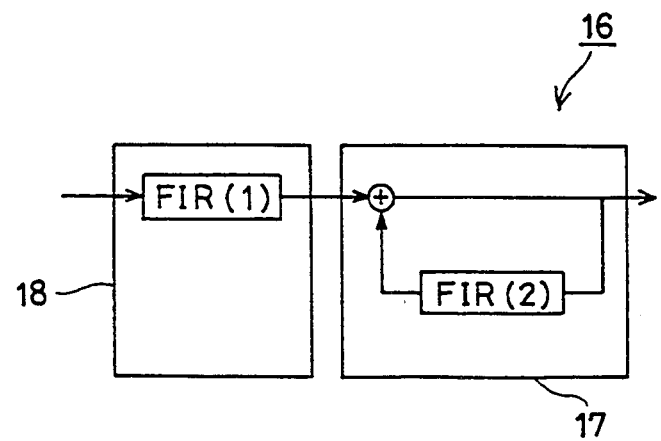
Figure 14:
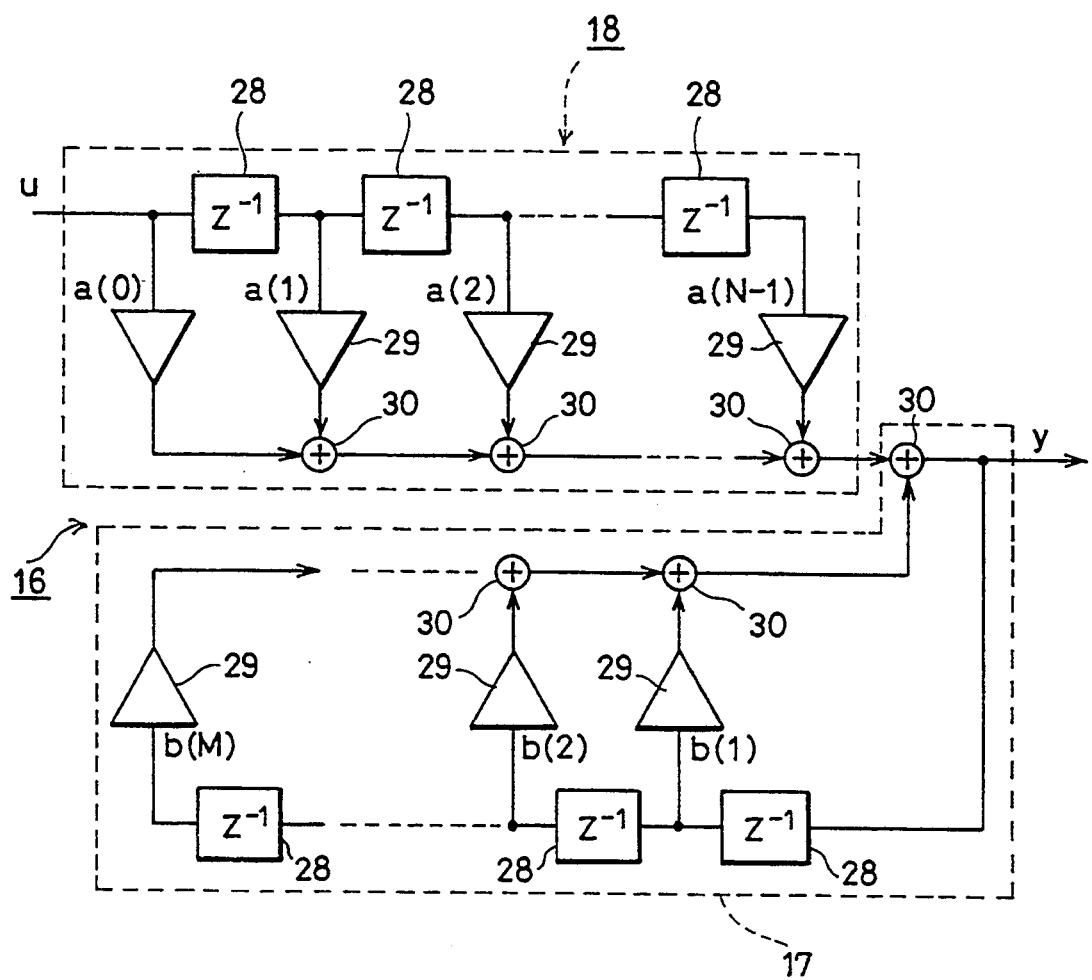
Figure 15:
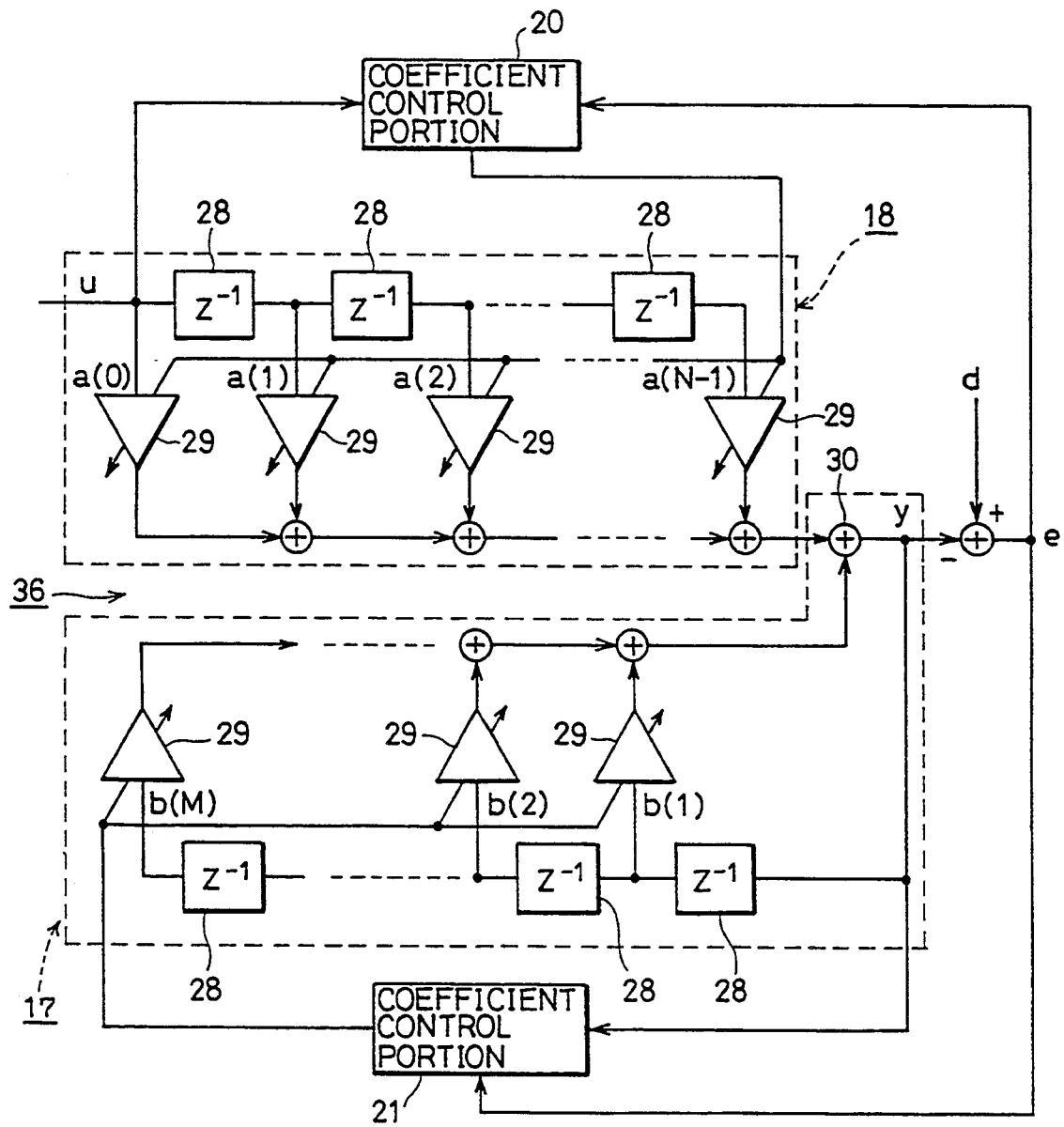
Figure 16:
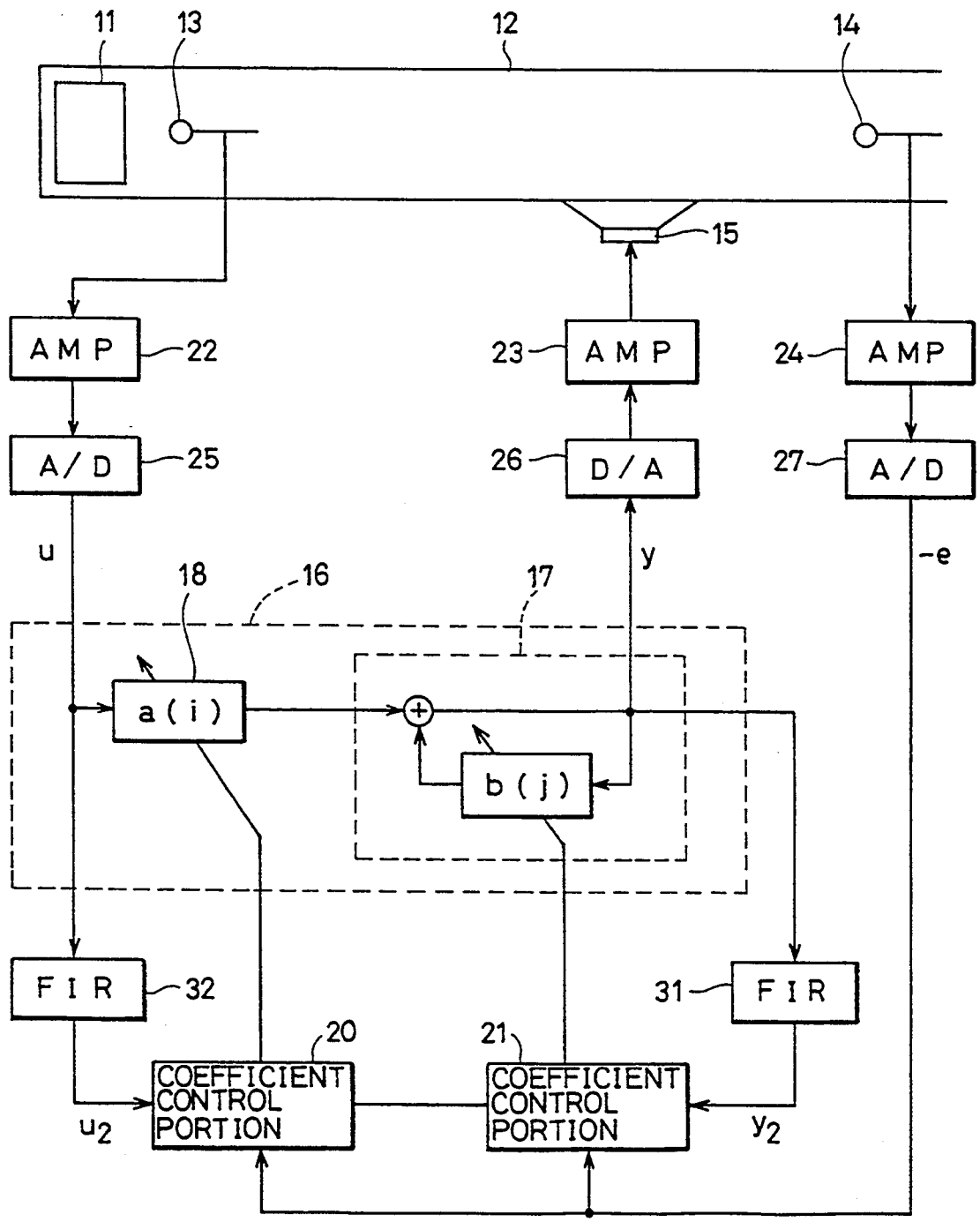
Figure 17:
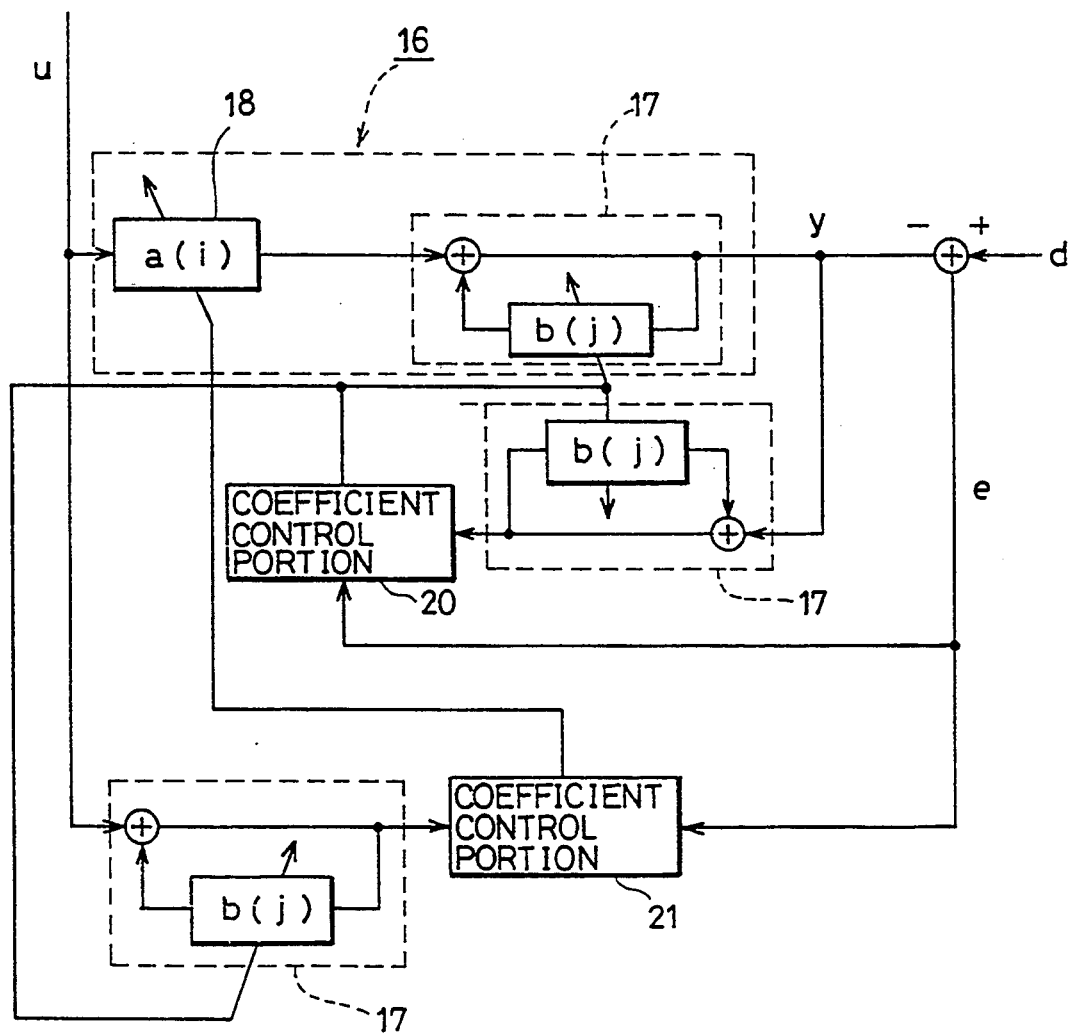

FIG. is a diagram schematically showing a noise cancellation apparatus as an active control apparatus using an IIR digital filter according to a sixth embodiment of the invention;

FIG. 7 is a diagram schematically showing a noise cancellation apparatus as an active control apparatus using an adaptive IIR digital filter according to a seventh embodiment of the invention;

FIG. 8 is a diagram schematically showing a noise cancellation apparatus as an active control apparatus using an adaptive IIR digital filter according to an eighth embodiment of the invention;

FIG. 9 is a diagram schematically showing a ninth embodiment in which the invention is applied to an active noise control apparatus;

FIG. 10 is a diagram schematically showing a tenth embodiment in which the invention is applied to an active noise control apparatus;

FIG. 11 is a diagram schematically showing a conventional active noise control apparatus;

FIG. 12 ia a view for use in illustration of the influence of a standing wave in a duct during noise cancellation control;

FIG. 13 is a diagram schematically showing the structure of IIR digital filter;

FIG. 14 is a circuit diagram showing the specific structure of an IIR digital filter;

FIG. 15 is a circuit diagram showing an active control apparatus using a conventional adaptive IIR digital filter;

FIG. 16 is a block diagram schematically showing a noise cancellation apparatus as an active control apparatus using a conventional adaptive IIR digital filter; and FIG. 17 is a circuit diagram showing an active control apparatus using a conventional adaptive IIR digital filter.

Figure 18:
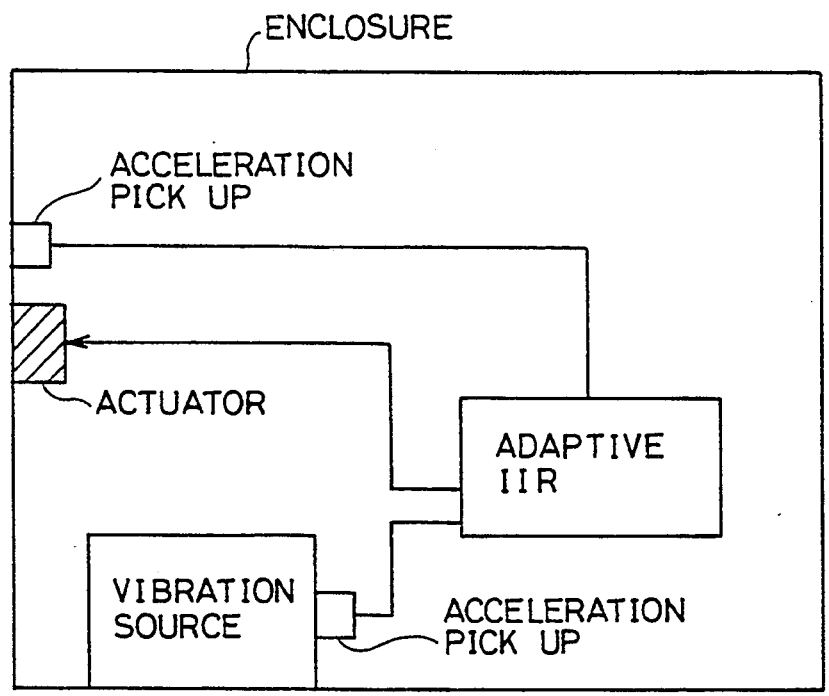
Figure 19:
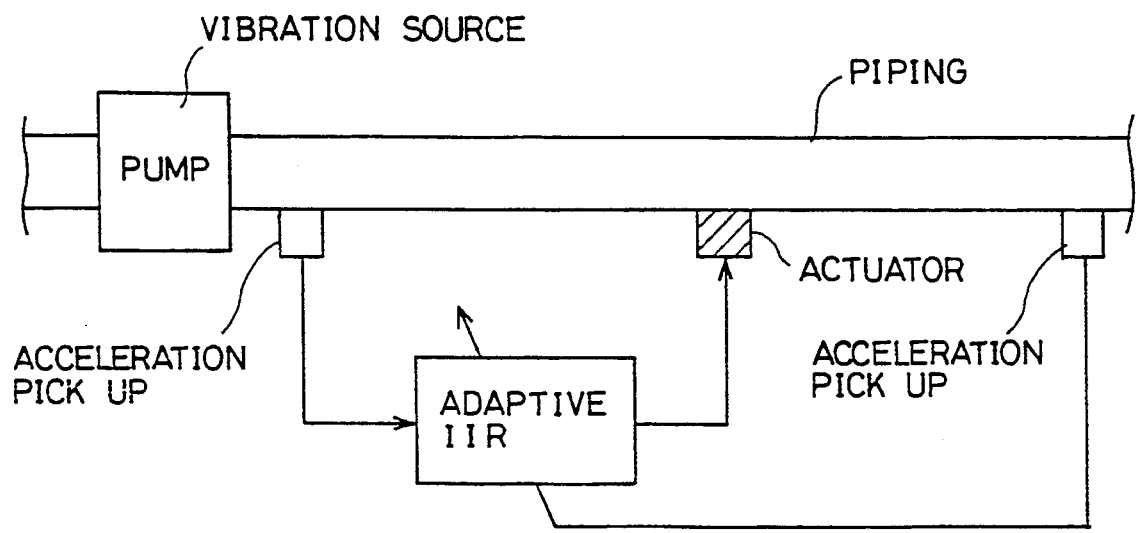

FIGS. 18 and 19 are views showing examples wherein the active control apparatus is used to control vibration.

Figure 20:
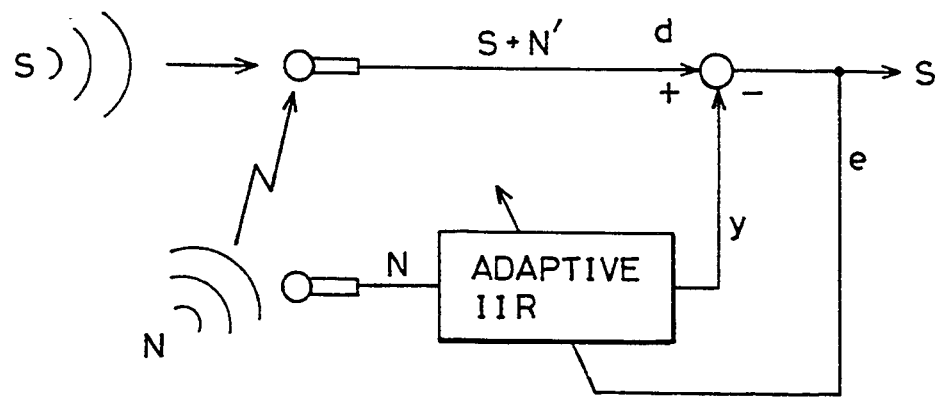

FIG. 20 is a view showing an example wherein the active apparatus is used for noise canceller.

DESCRIPTION OF THE PREFERRED EMBODIMENTS (1) When an Adaptive IIR Digital Filter is Used Now, embodiments of an active control apparatus using an adaptive IIR digital filter according to the invention will be described. Please note that like components having the same function as the conventional apparatus are designated with the same reference characters.

Figure 1:
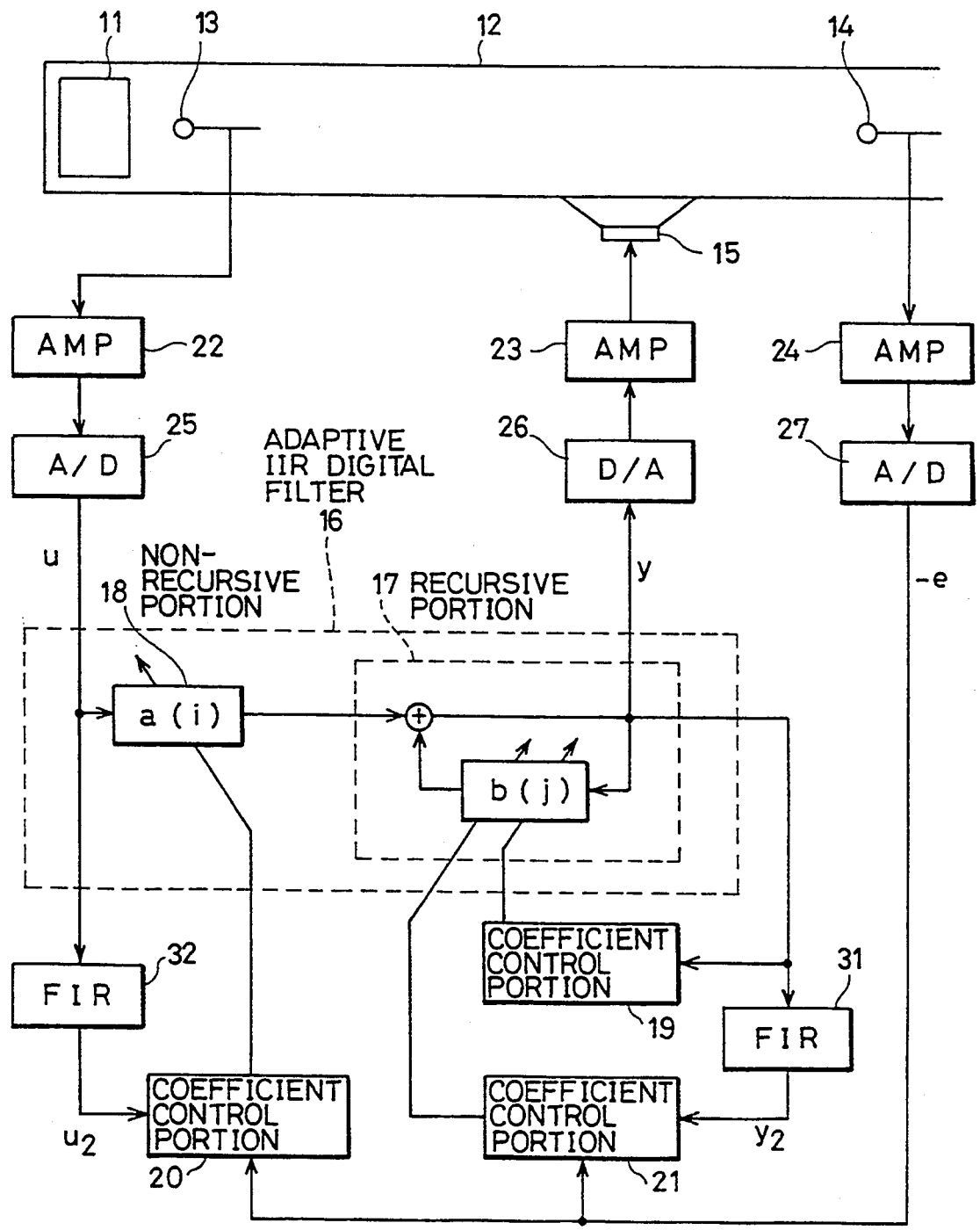
FIG. 1 is a diagram schematically showing a noise cancellation apparatus as an active control apparatus using an adaptive IIR digital filter according to a first embodiment of the invention.

FIG. 1 is a diagram schematically showing one embodiment of active control apparatus using an adaptive IIR digital filter according to the invention. A noise source 11 is disposed in a duct 12 having an opening at one end. In duct 12, a microphone for detecting noise 13 and a microphone for detecting noise cancellation error 14 are disposed opposite to noise source 11, and a speaker for noise cancellation 15 is disposed on the sidewall of duct 12. Noise detected at noise detection microphone 13 is sent through a preamplifier 22 to an A/D converter 25 and converted into a digital signal, the resultant noise signal $u(n)$ is subject to an operation at an adaptive IIR digital filter 16, and the result of operation is output as a noise cancellation signal $y(n)$ to a D/A converter 26. The noise cancellation signal converted into an analog signal at D/A converter 26 is output through a power amplifier 23 from speaker 15. The result of noise cancellation is detected at noise cancellation error detection 14, and input to coefficient control portions 20 and 21 through a preamplifier 24 and an A/D converter 27 as a noise cancellation error signal $-e(n)$. The input $u(n)$ of a non-recursive portion 18 is also input to a digital filter 32, and the output $u2(n)$ of digital filter 32 is to coefficient control portion 20. The output $y(n)$ o a recursive portion 17 is also input to a digital filter 31, and the output $y2(n)$ of a digital filter 31 is also input to coefficient control portion 21. The filter coefficients $a(i)$ and $b(j)$ of adaptive IIR digital filter 16 are updated so as to minimize the noise cancellation error signal. The updating formula at that time is represented by the following equations (16) and (17):

$$a(i,n+1)=a(i,n)+\alpha u2(n-i)\, e(n) \qquad (16)$$

$$b(j,n+1)=b(j,n)+\beta y2(n-j)\, e(n) \qquad (17)$$

where $\alpha$ and $\beta$ represent step size parameter and take a small positive value. In updating the filter coefficient $a(j)$ and $b(j)$, $f(n)$ of equation (13) may be used in place of $e(n)$ in equations (16) and (17). $y3(j,n)$ in equation (18) as follows may be used in place of $y2(n-j)$ in equation (17).

$$y3(j,\, n) = y2(n-j) + \sum_{k=1}^{M} b(k,\, n)\, y3(j,\, n-k) \qquad (18)$$

Please note that the same result can be obtained if a calculation portion for equation (18) is placed in a preceding stage to digital filter 31. Furthermore, updating of the filter coefficient $b(j)$ of recursive portion 17 is also conducted from coefficient control portion 19. In coefficient control portion 19, the output $y(n)$ of recursive portion 17 is input, filter coefficient $b(j)$ is updated based on the following equation (19) so as to minimize the level of output $y(n)$.

$$b(j,n+1)=b(j,n)-\gamma y(n-j)\, y(n) \qquad (19)$$

where $\gamma$ represents step size parameter and takes a small positive value. Updating of the filter coefficients based on equations (17) and (19) is executed in parallel or in a time dividing manner.

In this embodiment, filter coefficient updating is executed in parallel so as to minimize the output level of recursive portion 17 with respect to the filter coefficient of the recursive portion 17, the signal of recursive portion 17 can be suppressed from diverging. If noise is a random sound without periodicity, updating the filter coefficient of recursive portion 17 so as to minimize the output level of recursive portion 17 does not cancel a noise signal at recursive portion 17, a sound emitted from noise cancellation speaker 15 at that time cancels part of signal component fed back to noise detection microphone 13, and therefore higher noise cancellation effect can be expected.

Figure 2:
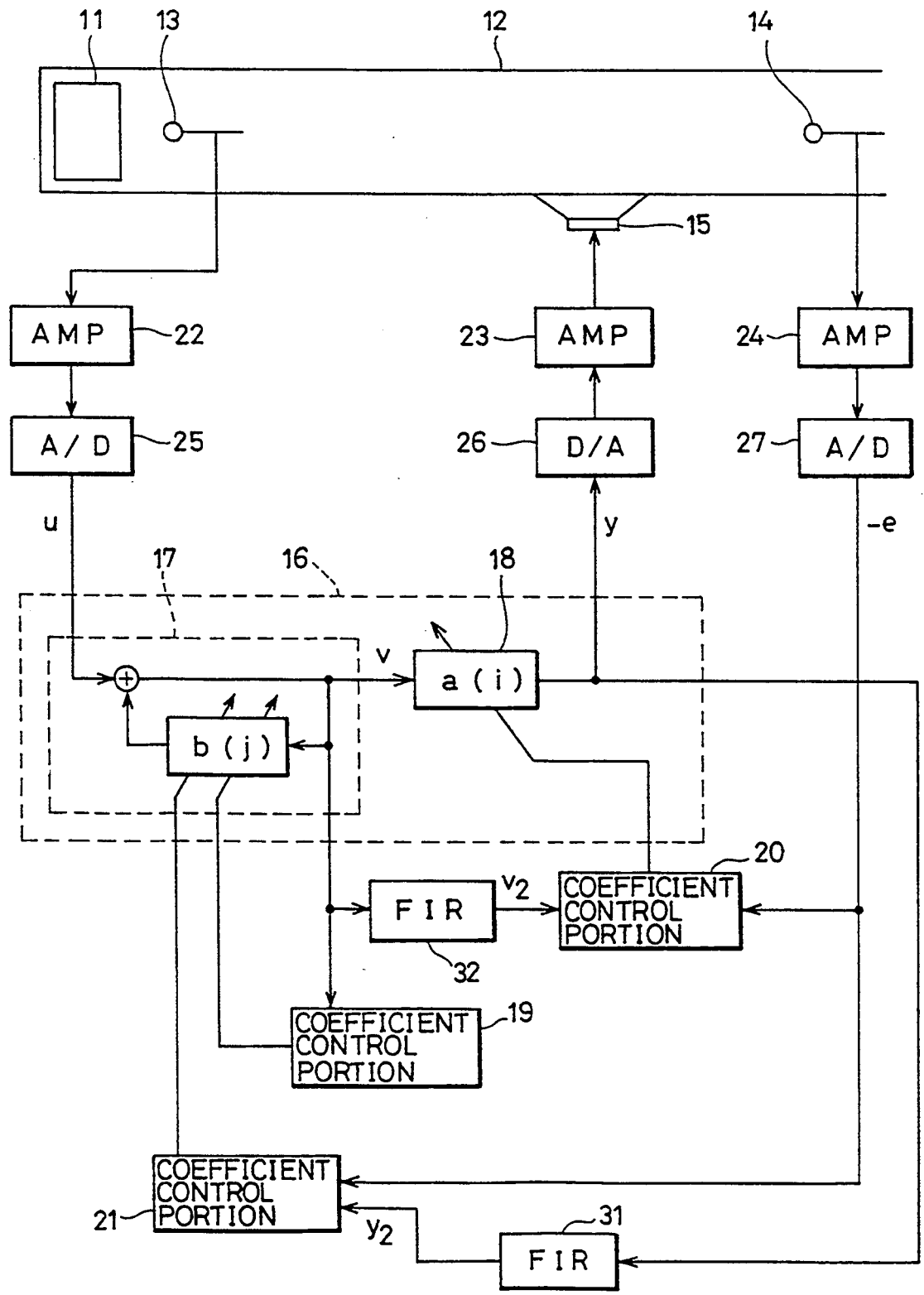
FIG. 2 is a diagram schematically showing a noise cancellation apparatus as an active control apparatus using an adaptive IIR digital filter according to a second embodiment of the invention.

FIG. 2 is a diagram schematically showing an active control apparatus using an adaptive IIR digital filter according to a second embodiment of the invention. The hardware construction of this embodiment is identical to that in FIG. 1 with the position of recursive portion 17 and non-recursive portion 18 in adaptive IIR digital filter 16 being exchanged. The other components are identical, and therefore detailed description of the hardware is omitted here.

In this embodiment, filter coefficient $a(i)$ is updated at coefficient control portion 20 based on the following equation (20):

$$a(i,n+1)=a(i,n)+\alpha v2(n-i)\, e(n) \qquad (20)$$

Filter coefficient $b(j)$ is updated at coefficient control portion 21 based on the following equation (17):

$$b(j,n+1)=b(j,n)+\beta y2(n-j)\, e(n) \qquad (17)$$

Further, filter coefficient $b(j)$ is updated based on the following equation (21) so as to minimize the level of output $v(n)$ of recursive portion 17 at coefficient control portion 19.

$$b(j,n+1)=b(j,n)-\gamma v(n-v)\, v(n) \qquad (21)$$

As in the case of the first embodiment, the updating of the filter coefficients based on equations (17) and (21) is executed in parallel or in a time dividing manner.

In this embodiment, since filter coefficient updating is executed in parallel so as to minimize the output level of recursive portion 17 with respect to the filter coefficient of recursive portion 17, the signal of recursive portion 17 can be suppressed from diverging. Furthermore, replacing the positions of non-recursive portion 18 and recursive portion 17, stability in filter coefficient updating in non-recursive portion 18 can be increased. As in the case of the foregoing embodiment, if noise is a random sound without periodicity, updating the filter coefficient of recursive portion 17 so as to minimize the output level of recursive portion 17 will not cancel the noise signal, a sound emitted from noise cancellation speaker 15 at that time cancels part of signal component fed back to noise detection microphone 13, and therefore higher noise cancellation effect can be expected.

Figure 3:
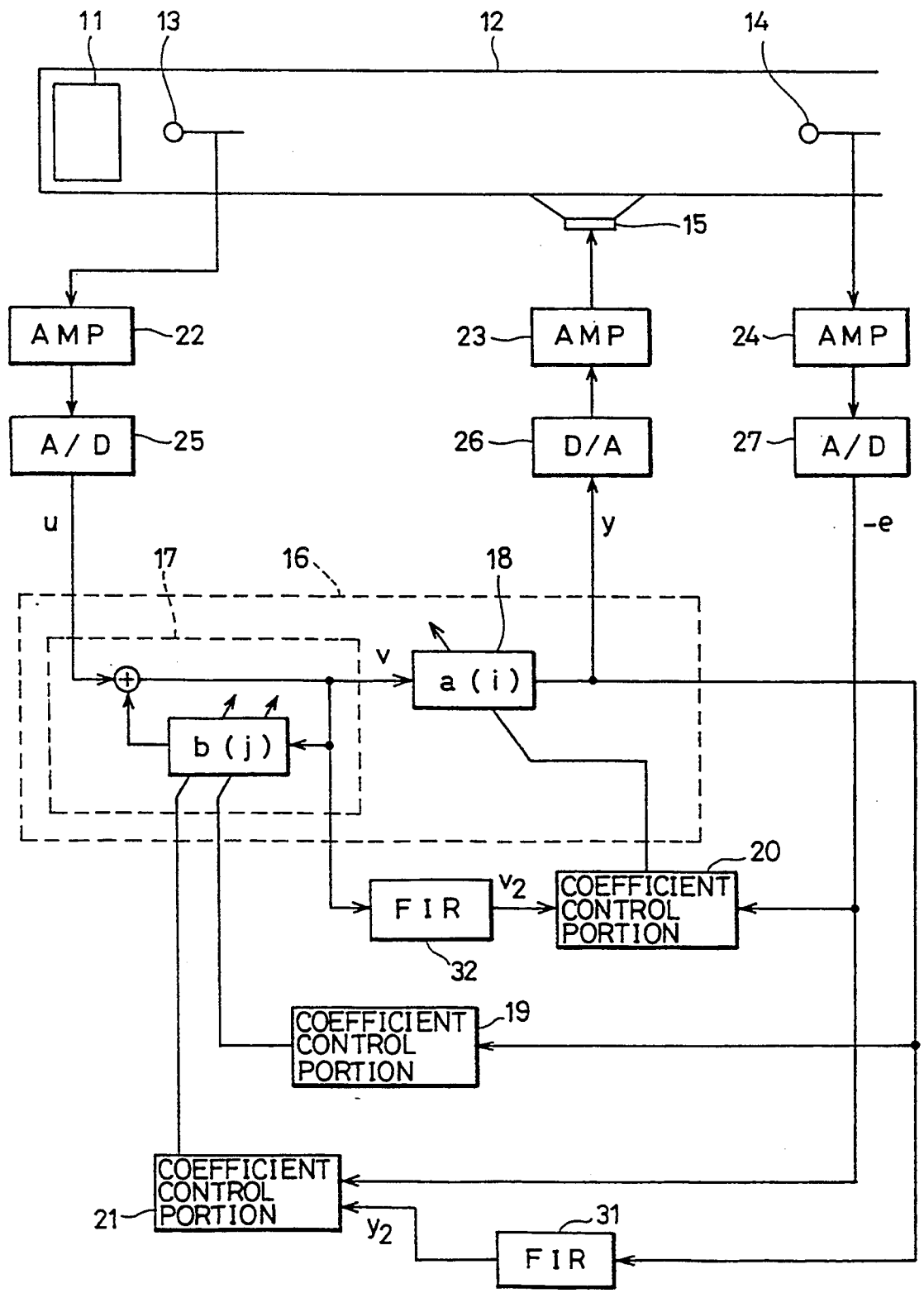
FIG. 3 is a diagram schematically showing a noise cancellation apparatus as an active control apparatus using an IIR digital filter according to a third embodiment of the invention.

FIG. 3 is a diagram schematically showing an active control apparatus utilizing an adaptive IIR digital filter according to a third embodiment of the invention. In the hardware construction of this embodiment, the input of the coefficient control portion 19 of the adaptive IIR digital filter shown in FIG. 2 is changed from the output $v(n)$ of the recursive portion to the output $y(n$ of the non-recursive portion. The other components are the same as the foregoing embodiments, and therefore detailed description of the hardware construction is omitted here.

Coefficient control portion 19 updates filter coefficient $b(n)$ based on the above-described equation (19) so as to minimized the level of the output $y(n)$ of non-recursive portion 18.

In this embodiment, as in the case of the first and second embodiments, filter coefficient updating is executed in parallel so as to minimize the output level of recursive portion 17, and therefore the signal of recursive portion 17 can be suppressed from diverging. Furthermore, if noise is a random sound without periodicity, updating of the filter coefficient of recursive portion 17 so as to minimize the output level of recursive portion 17 will not cancel a noise signal at recursive portion 17, a sound emitted from noise cancellation speaker 15 at the time will cancel part of signal component fed back to noise detection microphone 13, and therefore higher noise cancellation effect can be expected.

Figure 4:
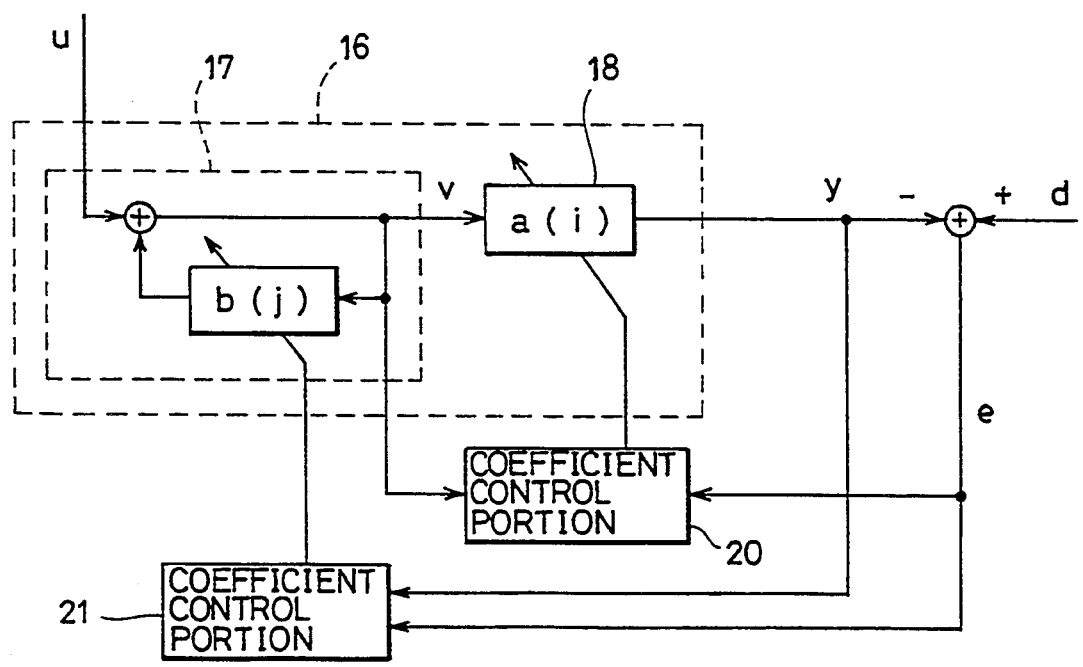
FIG. 4 is a diagram showing an active control apparatus using an adaptive IIR digital filter according to a fourth embodiment of the invention.

FIG. 4 is a diagram schematically showing an active control apparatus using an adaptive IIR digital filter according to a fourth embodiment of the invention, in which signal $u(n)$ is input to IIR digital filter 16, and signal $y(n)$ is output as a result. For the internal structure of IIR digital filter 16, recursive portion 17 having filter coefficient $b(j)$ is disposed in a preceding stage, while non-recursive portion 18 having filter coefficient $a(i)$ in a succeeding stage. Coefficient control portion 20 updates filter coefficient $a(i)$, and the output $v(n)$ of recursive portion 17 and output error $e(n)$ are input to coefficient control portion 20. The output $y(n)$ and output error $e(n)$ are input to IIR digital filter 16. Output error $e(n)$ is the difference between desired response $d(n)$ and the output $y(n)$ of IIR digital filter 16. Coefficient control portion 20 updates filter coefficient $a(i)$ so as to minimize the mean square value of output error $e(n)$ based on equation (22).

$$a(i,n+1)=a(i,n)+\alpha v(n-1) e(n) \quad (22)$$

Coefficient control portion 21 updates filter coefficient $b(j)$ based on equation (17).

$$b(j,n+1)=b(j,n)+\beta y(n-j) e(n) \quad (17)$$

where $\alpha$ and $\beta$ represent step size parameter and take a small positive value. In updating filter coefficient $b(j)$, $Y_0(j,n)$ in the following equation (15) may be used in place of $y(n-j)$ in equation (17).

$$y_0(j, n) = y(n - j) + \sum_{k=1}^{M} b(k, n) y_0(j, n - k) \quad (15)$$

In this embodiment, the output of non-recursive portion 18 is output without being passed through recursive portion 17. As a result, filter coefficient updating in non-recursive portion 18 results in coefficient updating of an FIR digital filter using the output of recursive portion 17 as an input signal. Accordingly, in coefficient updating in non-recursive portion 18, its stability and convergence are secured. Furthermore, if filter coefficients are updated based on equations (14) and (15), an operation corresponding to equation (14) has already been performed at recursive portion 17, thus permitting reduction of the amount of calculation or circuit size.

Figure 5:
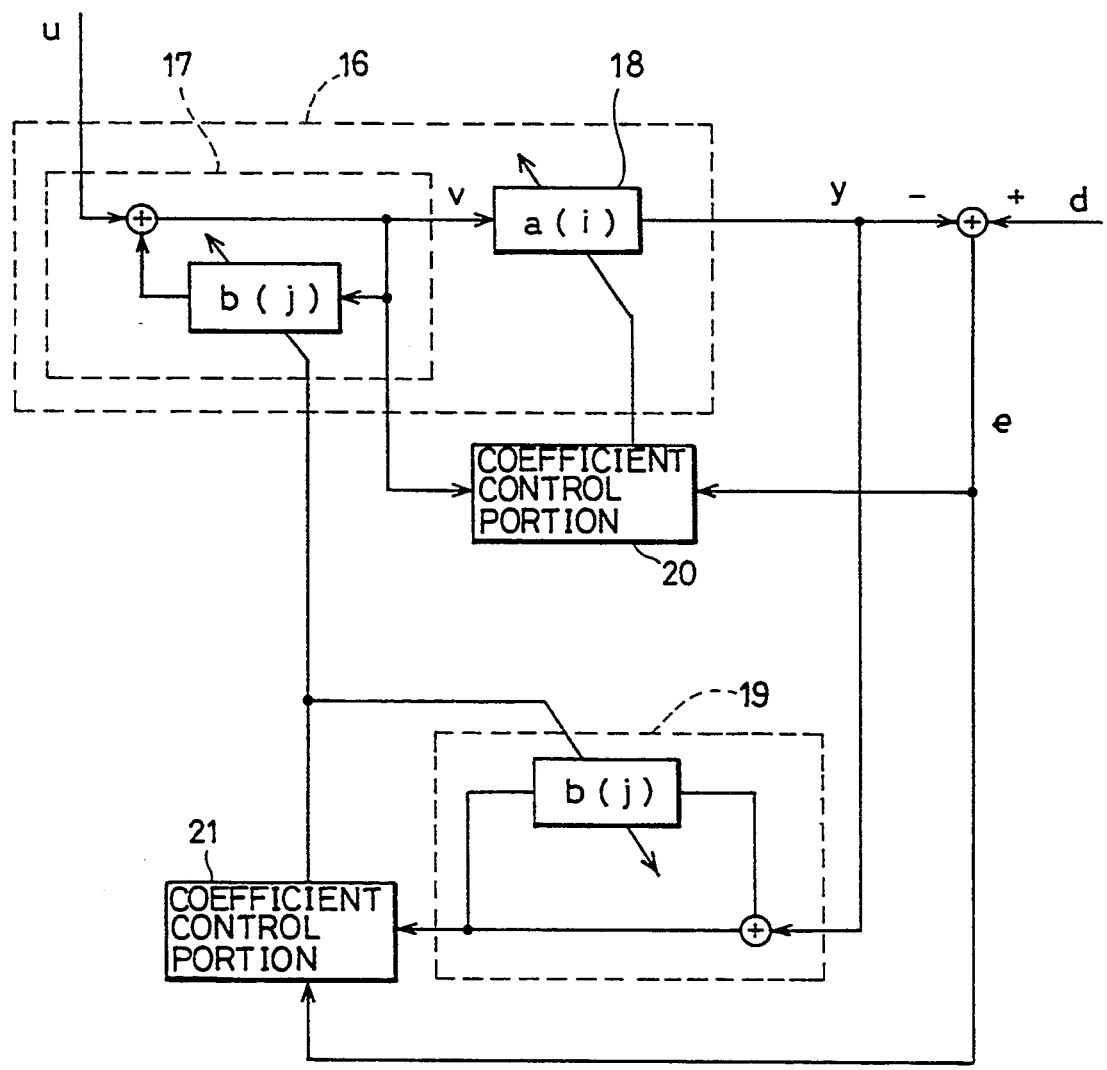
FIG. 5 is a diagram schematically showing an active control apparatus using an adaptive IIR digital filter according to a fifth embodiment of the invention.

FIG. 5 is a diagram schematically showing an active control apparatus using an adaptive IIR digital filter according to a fifth embodiment of the invention. Processing based on equation (15) in the embodiment shown in FIG. 4 is performed in coefficient control portion 21, but in the case of FIG. 5, this processing is performed outside coefficient control portion 21. A recursive digital filter 19 shown in FIG. 5 performs the processing. In updating filter coefficient $b(j)$, the following $f(n)$, the moving average of $e(n)$ may be used in place of $e(n)$ in equation (17).

$$f(n) = e(n) + \sum_{l=1}^{L2} c(l) e(n - l) \quad (13)$$

where $c(l)$ represents the weight of the moving average, while L2 represents the number of data over which the mean value is produced.

In this embodiment, as in the case of the fourth embodiment described above, filter coefficient updating at non-recursive portion 18 can give the same effect as filter coefficient updating in an FIR digital filter using the output of recursive portion 17 as an input signal. Therefore, stability and convergence in updating the filter coefficient of non-recursive portion 18 is further secured. In filter coefficient updating utilizing equations (14) and (15), an operation corresponding to equation (14) has already been performed at recursive portion 17 and therefore is not necessary, thus reducing the amount of calculation or circuit size.

Figure 6:
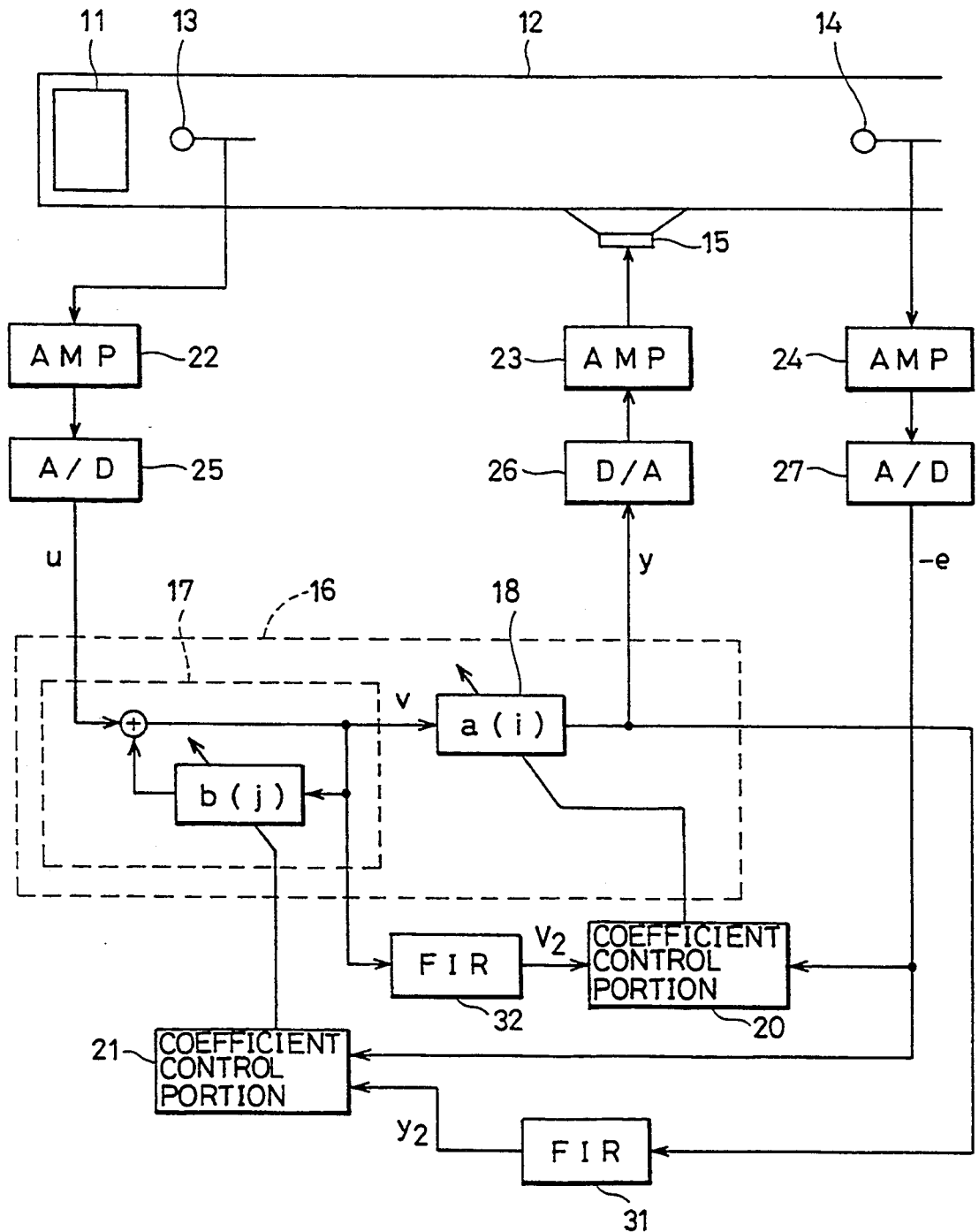

FIG. 6 is a diagram showing an active control apparatus using an adaptive IIR digital filter according to a sixth embodiment of the invention. A noise source 11 is disposed in a duct 12 having an opening at one end, a microphone for noise detection 13 and a microphone for detecting noise cancellation error 14 are disposed opposite to noise source 11, and a speaker for noise cancellation 15 is disposed on the side wall of duct 12. A noise signal $u(n)$ detected at noise detection microphone 13 sent to A/D converter 25 through a preamplifier 22 for A-D conversion is subject to an operation at an adaptive IIR digital filter 16, and the result of the operation is output as a noise cancellation signal $y(n)$ to a D/A converter 26. The noise cancellation signal converted into an analog signal at D/A converter 26 is output through a power amplifier 23 from speaker 15. The result of noise cancellation is detected at noise cancellation error detection microphone 14, and input to coefficient control portion 20 and coefficient control portion 21 as a noise cancellation error signal $-e(n)$ through an A/D converter 27. The output $v(n)$ of recursive portion 17 is also input to digital filter 32, and the output $v_2(n)$ of digital filter 32 is input to coefficient control portion 20. The output $y(n)$ of non-recursive portion 18 is also input to digital filter 31. The output $y_2(n)$ of digital filter 31 is also input to coefficient control portion 21. The filter coefficients $a(i)$ and $b(j)$ of adaptive IIR digital filter 16 are updated so as to minimize the noise cancellation error signal. The updating formula at the time is given by the following equations (20) and (17):

$$a(i,n+1)=a(i,n)+\alpha v2(n-1) e(n) \quad (20)$$

$$b(j,n+1)=b(j,n)+\beta y2(n-j) e(n) \quad (17)$$

where $\alpha$ and $\beta$ represent step size parameter and takes a small positive value. In updating filter coefficient $b(j)$, $f(n)$ in equation (13) may be used in place of $e(n)$ in equation (17). y3$(j, n)$ in equation (18) may be used in place of y2$(n-j)$ in equation (17).

$$y3(j, n) = y2(n - j) + \sum_{k=1}^{M} b(k, n) y3(j, n - k) \quad (18)$$

In this embodiment as in the case of the foregoing fifth embodiment, filter coefficient updating at non-recursive portion 18 can give the same effect as filter coefficient updating at an FIR digital filter utilizing the output of recursive portion 17 as an input signal, and therefore stability and convergence in filter coefficient updating at non-recursive portion can be secured. Further, the same result is obtained by placing a calculation portion for equation (18) in a preceding stage to digital filter 31, thereby replacing the order. In filter coefficient updating utilizing equations (14) and (15), an operation corresponding to equation (14) has already been performed at recursive portion 17, and is not necessary, thus reducing the amount of calculation or the size of circuit.

FIG. 7 is a diagram showing an active control apparatus using an adaptive IIR digital filter according to a seventh embodiment of the invention. A noise source 11 is disposed in a duct 12 having an opening at one end, and a microphone for noise detection 13 and a microphone for detecting noise cancellation error 14 are disposed opposite to noise source 11 in duct 12, with a noise cancellation speaker 15 being disposed on the sidewall of duct 12. Noise signal $u(n)$ detected at noise detection microphone 13, and sent to an A/D converter 25 through a preamplifier 22 for A-D conversion is subject to an operation at an adaptive IIR digital filter 16, and the result of operation is output as a noise cancellation signal $y(n)$ to a D/A converter 26. The noise cancellation signal converted into an analog signal at the D/A converter is an output from noise cancellation speaker 15 through a power amplifier 23. The result of noise cancellation is detected at noise cancellation error detection microphone 14, and input to coefficient control portion 20 and coefficient control portion 21 through an A/D converter 27 as a noise cancellation error signal $-e(n)$. The input $u(n)$ of a non-recursive portion 18 is also input to digital filter 32, and the output $u_2(n)$ of digital filter 32 is input to coefficient control portion 20. The output $y(n)$ of recursive portion 17 is input to digital filter 31, and the output $y2(n)$ of digital filter 31 is input to coefficient control portion 21. The filter coefficients $a(i)$ and $b(j)$ of adaptive IIR digital filter 16 are updated so as to minimize the noise cancellation error signal. The updating formula at that time is given by the following equations (16) and (17).

$$a(i,n+1) = a(i,n) + \alpha u_2(n-i) \, e(n) \tag{16}$$

$$b(j,n+1) = b(j,n) + \beta y_2(n-j) \, e(n) \tag{17}$$

where $\alpha$ and $\beta$ represent step size parameter and take a small positive value. In updating filter coefficient $a(j)$ and $b(j)$, $f(n)$ of equation (13) may be used in place of $e(n)$ in equations (16) and (17). $y3(j,n)$ in the following equation (18) may be used in place of $y2(n-j)j)$ in equation (17).

$$y3(j, n) = y2(n - j) + \sum_{k=1}^{M} b(k, n) \, y3(j, n - k) \tag{18}$$

Please note that the same result is obtained by placing a calculation portion for equation (18) in a preceding stage to digital filter 31, thereby replacing the order. The updating of filter coefficient $b(j)$ of recursive portion 17 can also be performed from coefficient control portion 19. Coefficient control portion 19 inputs the output $y(n)$ of recursive portion 17, and updates filter coefficient $b(j)$ based on equation (19) so as to minimize the level of output $y(n)$.

$$b(j,n+1) = b(j,n) - \gamma y(n-j) \, y(n) \tag{19}$$

where $\gamma$ represents step size parameter and takes a small positive value. Herein, the operation of updating filter coefficients based on equation (19) under the control of coefficient control portion 19 is controlled by the power P of the output signal $y(n)$ of recursive portion 17. More specifically, the output signal $y(n)$ of recursive portion 17 is input to a level detection portion 33, and the power P of output signal $y(n)$ is calculated. Coefficient control portion 19 performs a filter coefficient updating operation only when the input power P is larger than a prescribed reference power. Filter coefficient updating based on equations (17) and (19) is executed in parallel or in a time dividing manner.

In the above-described embodiment, operation at coefficient control portion 19 is permitted only when the signal level detected at level detection portion 33 is more than a prescribed reference value. As a result, the signal at recursive portion 17 can be suppressed from diverging, and stable filter coefficient updating can be achieved at adaptive IIR digital filter 16. Furthermore, since coefficient control portion 19 operates only when the signal level detected at level detection portion 33 is more than a prescribed reference value, appropriate noise cancellation processing can be performed not only to a random sound but also to a periodic signal without canceling a signal at recursive portion 17.

FIG. 8 is a diagram showing an active control apparatus using an adaptive IIR digital filter according to an eighth embodiment of the invention. The structure in FIG. 8 is identical to that in FIG. 7 with the position of recursive portion 17 and non-recursive portion 18 being exchanged in adaptive IIR digital filter 16. Filter coefficient $a(i)$ is updated at coefficient control portion 20 based on the following equations:

$$a(i,n+1) = a(i,n) - \alpha v_2(n-i) \, e(n) \tag{20}$$

Filter coefficient $b(j)$ is updated at coefficient control portion 21 based on equation (17):

$$b(j,n+1) = b(j,n) + \beta y_2(n-j) \, e(n) \tag{17}$$

Further, filter coefficient $b(j)$ is updated at coefficient control portion 19 based on equation (21) so as to minimize the level of the output $v(n)$ of recursive portion 17.

$$b(j,n+1) = b(j,n) - \gamma v(n-j) \, v(n) \tag{21}$$

The output signal $v(n)$ of recursive portion 17 is input to level detection portion 33, and the power P of output signal $v(n)$ is calculated. Coefficient control portion 19 executing equation (21) performs a filter coefficient updating operation only if the input power P is larger than a prescribed reference power. At that time, filter coefficient updating based on equations (17) and (21) is executed in parallel or in a time dividing manner.

In the above-described embodiment, as in the case of the foregoing embodiments, the operation of coefficient control portion 19 is permitted only if a signal level detected at level detection portion 33 is more than a prescribed reference value, and therefore a signal at recursive portion 17 can be suppressed from diverging. As a result, in adaptive IIR digital filter 16, stable filter coefficient updating can be achieved. Since coefficient control portion 19 operates only if a signal level detected at level detection portion 33 is larger than a prescribed reference value, appropriate noise cancellation processing can be performed not only to a random sound but also a periodic signal without canceling a signal at recursive portion 17.

(2) When an Adaptive FIR Digital Filter is Used

FIG. 9 is a diagram showing an active noise control apparatus using an adaptive FIR digital filter according to one embodiment of the invention. This embodiment corresponds to FIG. 11 and the same components are designated with the same reference characters as in FIG. 11.

In FIG. 9, noise cancellation error signal $e1(n)$ which is the output of A/D converter 27 is input to first and second coefficient control portions 44 and 46. An operation based on equation (5) is performed at a first correction digital filter 45. The output signal $u11(n)$ of correction digital filter 45 is input to second coefficient control portion 46, in which the filter coefficient $b1(i)$ of a second adaptive digital filter 43 is updated based on equation (4). The transfer characteristic of correction digital filter 45 accounts for the transfer characteristic of the path from the $y1(n)$ of second adaptive digital filter 43 to second coefficient control portion 46. Noise cancellation signal $y1(n)$ is also input to a third adaptive FIR digital filter 47. The filter coefficient $b1(i)$ of third adaptive digital filter 47 is updated simultaneously with updating of the filter $b1(i)$ of second adaptive digital filter 43. Accordingly, the transfer characteristic of the third adaptive digital filter 47 is the same as that of second adaptive digital filter 43. The output signal $y11(n)$ of third adaptive digital filter 47 is input to a second correction FIR digital filter 48. Second correction digital filter 48 is identical to first correction digital filter 45. The output $y21(n)$ of second correction digital filter 48 is input to first coefficient control portion 44. First coefficient control portion 44 updates the filter coefficient $a1(i)$ of first adaptive digital filter 41 based on the following equation (22):

$$a1(i,n+1)=a1(i,n)-\alpha \cdot y21(n-i) \cdot e1(n) \quad (22)$$

where $\alpha$ represents a step size parameter and takes a small positive value.

$y21(n)$ is produced at second correction digital filter 48 based on the following equation (23):

$$y21(n) = \sum_{i=0}^{L-1} h1(i) \cdot y11(n-i) \quad (23)$$

where $h1(i)$ represents the filter coefficient of second correction digital filter 48, and L is the tap number of filter 48.

$y11(n)$ is produced at third adaptive digital filter 47 based on the following equation (24):

$$y11(n) = \sum_{i=0}^{N-1} b1(i,n) \cdot y1(n-i) \quad (24)$$

where $b1(i,n)$ represents the filter coefficient of second adaptive digital filter 43 in time n, N is the tap number of the second and third adaptive digital filters 43, 47.

If the filter coefficients $a1(i)$ and $b1(i)$ of first and second adaptive digital filters 41 and 43 are updated using a series of equations 4, 5, and 22-24, the average power of error signal $e1(n)$ can be reduced.

FIG. 10 is an active noise control apparatus using an adaptive FIR digital filter according to one embodiment of the invention. In this embodiment, the same components as the foregoing embodiment in FIG. 9 are designated with the same reference characters. This embodiment indicates the case in which a desired response $d1(n)$ with respect to the output $y1(n)$ Of second adaptive digital filter is obtained, an output error $e01(n)$ $(=d1(n) - y1(n))$ can directly be provided. In this case, two correction digital filters 45 and 48 in the previous embodiment can be omitted. Accordingly, updating of the filter coefficient $a1(i)$ of first adaptive digital filter 41 is given by the following equation (25), and the updating is performed at first coefficient control portion 44.

$$a1(i,n+1)=a1(i,n)+\alpha 1 \cdot y11(n-1) \cdot e01(n) \quad (25)$$

where $\alpha 1$ is a step size parameter and takes a small positive value. $y11$ is the output of third adaptive digital filter 47 and is produced from equation (24).

The filter coefficient $b1(i)$ of second adaptive digital filter 43 is given by the following equation (26), and updated at second coefficient control portion 46.

$$b1(i,n+1)=b1(i,n)+\beta 1 \cdot u1(n-1) \cdot e01(n) \quad (26)$$

where $\beta 1$ is a step size parameter and takes a small positive value. In this embodiment, a second adder 49 constitutes error output means. First and second coefficient control portions 44, 46 and third adaptive digital filter 47 constitute coefficient control means.

This invention is applicable to an active control apparatus other than an active noise control apparatus. The examples of such application are shown in FIGS. 18–20. According to FIGS. 18 and 19, the active control apparatus is used for controlling vibration and the active control apparatus is used as a noise cancelled in FIG. 20. With reference to FIG. 20, noise can be canceled by updating the filter coefficient in a manner that the value "e" becomes minimum.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An active control apparatus for controlling an amount of a physical phenomenon at a desired value;
    detection means for detecting said amount of physical phenomenon;
    control signal output means responsive to a detection signal obtained by said detection means for outputting a control signal to control said amount of physical phenomenon at said desired value; and
    error output means for outputting an error between the desired value of physical phenomenon and an actual amount of physical phenomenon,
    said control signal output means including an adaptive digital filter formed of a non-recursive filter and a recursive filter, first coefficient control means for updating a filter coefficient of said adaptive digital filter so as to minimize the level of an output signal from said error output means, and second coefficient control means for controlling a filter coefficient of said recursive filter so as to minimize the output signal level of said recursive filter.

2. An active control apparatus as recited in claim 1, wherein the detection signal from said detection means is sent to said recursive filter via said non-recursive filter.

3. An active control apparatus as recited in claim 1, wherein the detection signal from said detection means is sent to said non-recursive filter via said recursive filter.

4. An active control apparatus as recited in claim 3, wherein said second coefficient control means updates the filter coefficient by taking into account an output signal from said non-recursive filter.

5. An active control apparatus as recited in claim 1, wherein said control signal output means further includes level detection means for detecting the level of said control signal, and means responsive to the level detected by level detection means for operating said second coefficient control means.

6. An active control apparatus as recited in claim 1, wherein said control signal output means further includes level detection means for detecting the level of the output signal of said recursive filter and means responsive to the level detected by said level detection means for operating said second coefficient control means.

7. An active control apparatus for controlling an amount of a physical phenomenon at a desired value, comprising:

detection means for detecting said amount of physical phenomenon;

control signal output means responsive to a detection signal obtained by said detection means for outputting a control signal to control said amount of physical phenomenon at said desired value; and error output means for outputting an error between said desired value of physical phenomenon and an actual amount of physical phenomenon, said control signal output means including an adaptive digital filter formed of a non-recursive filter and a recursive filter, said detection signal being sent to said non-recursive filter via said recursive filter, an output signal from said non-recursive filter becoming said control signal, first coefficient control means responsive to an output signal from said error output means and the output signal of said recursive filter for updating the filter coefficient of said non-recursive filter so as to minimize the level of the output signal of the error output means, and second coefficient control means responsive to an output signal from said error output means and said control output signal for controlling the filter coefficient of said recursive filter.

8. An active control apparatus for controlling an amount of a physical phenomenon at a desired value, comprising:

detection means for detecting said amount of physical phenomenon;

control signal output means responsive to a detection signal obtained by said detection means for outputting a control signal to control said amount of physical phenomenon at said desired value; and error output means for outputting an error signal between said desired value of physical phenomenon and an actual amount of physical phenomenon, said control signal output means including a first digital filter for outputting said control signal, a second digital filter for receiving said control signal, an addition signal which is a sum of detection signal from said detection means and an output signal from said second digital filter being input to said first digital filter, first coefficient control means responsive to said error signal and said addition signal for controlling a filter coefficient of said first digital filter, and second coefficient control means responsive to said error signal and a signal obtained by filtering said control Signal with the same filtering characteristic adopted by said first digital filter, for controlling a filter coefficient of said second digital filter.

* * * * *